United States Patent
Vos

(10) Patent No.: US 7,429,785 B2
(45) Date of Patent: Sep. 30, 2008

(54) STACKED INTEGRATED CIRCUIT CHIP ASSEMBLY

(75) Inventor: Chad A. Vos, Dallas, TX (US)

(73) Assignee: Littelfuse, Inc., Des Plaines, IL (US)

( * ) Notice: Subject to any disclaimer, the term of this patent is extended or adjusted under 35 U.S.C. 154(b) by 307 days.

(21) Appl. No.: 11/254,163

(22) Filed: Oct. 19, 2005

(65) Prior Publication Data

US 2007/0085185 A1   Apr. 19, 2007

(51) Int. Cl.
*H01L 23/02* (2006.01)
(52) U.S. Cl. .................. 257/686; 257/E23.085
(58) Field of Classification Search ............ 257/685, 257/686
See application file for complete search history.

(56) References Cited

U.S. PATENT DOCUMENTS

| | | | |
|---|---|---|---|
| 3,609,512 A | 9/1971 | Lewis | |
| 3,978,514 A | 8/1976 | Ogawa et al. | |
| 3,982,268 A | 9/1976 | Anthony et al. | |
| 5,008,602 A | 4/1991 | Stevens et al. | |
| 5,012,323 A | 4/1991 | Farnworth | |
| 5,279,991 A | 1/1994 | Minahan et al. | |
| 5,281,846 A | 1/1994 | Kaiser | |
| 5,291,061 A | 3/1994 | Ball | |
| 5,323,060 A | 6/1994 | Fogal et al. | |
| 5,326,994 A | 7/1994 | Giebel et al. | |
| 5,399,898 A | 3/1995 | Rostoker | |
| 5,422,435 A | 6/1995 | Takiar et al. | |
| 6,259,123 B1 | 7/2001 | Kelberlau et al. | |
| 6,407,456 B1 | 6/2002 | Ball | |
| 6,580,789 B1 | 6/2003 | Simpson et al. | |
| 6,876,742 B1 | 4/2005 | Sacca | |
| 7,224,052 B2 * | 5/2007 | Nishizawa et al. | 257/679 |
| 7,266,195 B1 | 9/2007 | Dupuis et al. | |
| 2004/0070050 A1 | 4/2004 | Chi | |
| 2004/0188818 A1 * | 9/2004 | Wang | 257/685 |

OTHER PUBLICATIONS

Teccor Electronics P3002SB Device, Top and Bottom Assembly View (undated).
Teccor Electronics B1xx1UA4 6-pin Device, Top and Side Assembly View (undated).
Littelfuse, Inc., SP721 TVS Doiode Arrays, (undated).
Semtech Product Brochure, Low Cap. 3.3 Volt TVS, type LC3-3.3, Oct. 14, 20.
Office Action in U.S. Appl. No. 11/254,162, dated Apr. 8, 2008.
Office Action in U.S. Appl. No. 11/254,164, dated Jan. 28, 2008.
Ya-Chin King et al. Punch Through Transient Voltage Suppressor For Low-Voltage Electronics IEEE Electron Device Letters, vol. 16 No. 7, Jul. 1995, pp. 303-305 http://ieeexplore.ieee.org/iel1/55/8822/00388715.pdf?arnumber=388715.

* cited by examiner

*Primary Examiner*—Leonardo Andujar
*Assistant Examiner*—Krista Soderholm
(74) *Attorney, Agent, or Firm*—Roger N. Chauza, PC

(57) ABSTRACT

A stacked arrangement of integrated circuit chips are bonded to a lead frame. Two side-by-side integrated circuit chips have bottom contact pads bonded to a lead frame structure having contact terminals. The two side-by-side integrated circuits have top contact pads bonded to an overlying integrated circuit chip. A low profile integrated circuit assembly is achieved without using bond wires or preforms, and which is well adapted for SO-8 packages.

21 Claims, 6 Drawing Sheets

STACKED INTEGRATED CIRCUIT CHIP ASSEMBLY

RELATED APPLICATIONS

This non-provisional patent application is related to U.S. patent application entitled "Linear Low Capacitance Overvoltage Protection Circuit" by Kelly C. Casey, application Ser. No. 11/254,162, filed on even date herewith. This non-provisional patent application is also related to U.S. patent application entitled "Integrated Circuit Providing Overvoltage Protection For Low Voltage Lines" by Chad A. Vos, application Ser. No. 11/254,164, filed on even date herewith.

TECHNICAL FIELD OF THE INVENTION

The present invention relates in general to the packaging of integrated circuit chips, and more particularly to the packaging of multiple integrated circuit chips in the same package.

BACKGROUND OF THE INVENTION

Many integrated circuits are fastened to a lead frame which constitutes the metallic terminals for connecting the packaged integrated circuit to other circuits on a printed circuit board, or the like. Generally, a single integrated circuit chip is mounted to the lead frame and then encapsulated to form a packaged device. However, the prior art is replete with teachings of the integration of multiple integrated circuit chips into a single package. This allows multiple functions to be provided by a single packaged device. In addition, this compact arrangement reduces the space required for the package, as compared to several individual packaged devices, as well as reduces the pin count, again as compared to the number of pins that might be required of the multiple individual packaged devices.

The integration of multiple chips into a single package is not unlimited, as heat dissipation can be a factor, as well as the overall size of the package employed. JEDEC standards control the type of packages accepted by the integrated circuit industry. While large packages are available, manufacturers attempt to maintain the package size as small as possible to maintain competitiveness in the market, and increase density of the circuits on an printed circuit board.

In a typical integrated circuit package employing multiple chips, it is a common practice to mount the chips separately and provide interconnections between the chips using wires bonded to the pads of the chips. The contact pads of one or more of the chips can be soldered to the leads of the metallic lead frame. The assembly then undergoes a molding process where a liquified material is injected into a mold which, when solidified, provides mechanical protection to the lead frame and chips attached thereto.

There are different techniques for stacking integrated circuit chips together in conjunction with a lead frame. Some of the techniques are set forth in U.S. Pat. No. 6,919,627 by Liu et al; U.S. Pat. No. 6,897,565 by Pflughaupt et al; U.S. Pat. No. 6,890,798 by McMahon; U.S. Pat. No. 6,861,760 by Oka et al; U.S. Pat. No. 6,841,858 by Shim et al; U.S. Pat. No. 6,806,559 by Gann et al; U.S. Pat. No. 6,777,648 by Coomer; U.S. Pat. No. 6,759,737 by Seo et al and U.S. Pat. No. 6,753,207 by Hur.

It can be seen that a need exists for a technique for integrating multiple chips into an integrated circuit package without using bonding wires. Another need exists for a method of soldering chips directly together, and to a lead frame to simplify the integration process and to facilitate assembly thereof.

SUMMARY OF THE INVENTION

In accordance with the principles and concepts of the invention, disclosed is a packaged integrated circuit where the integrated circuit chips are stacked one on top of another to provide a low profile chip assembly without using bond wires or preforms. The bottom two integrated circuit chips are arranged side by side and are soldered to a lead frame. The third integrated circuit chip is stacked over the bottom two integrated circuit chips and soldered directly to the bottom two chips. The top integrated circuit chip is not connected directly to the lead frame.

In accordance with one embodiment of the invention, disclosed is a stacked integrated circuit assembly which includes a lead frame structure having contact terminals, and a first integrated circuit having bottom contact pads bonded to respective lead frame contact terminals. The integrated circuit package further includes a second integrated circuit having bottom contact pads bonded to respective lead frame contact terminals. The first and second integrated circuits are positioned side by side on the lead frame structure, and the first and second integrated circuits each have at least one top contact pad. Included is a third integrated circuit lying on top of at least a portion of the first and second integrated circuits, where the third integrated circuit has bottom contact pads bonded directly to the top contacts of the first and second integrated circuits.

In accordance with another embodiment of the invention, disclosed is a stacked integrated circuit assembly having a lead frame structure with contact terminals, and a first diode array integrated circuit having a plurality of diodes, where the first diode array integrated circuit has bottom contact pads corresponding to respective anodes of the diodes. The bottom contact pads are bonded to respective lead frame contact terminals, and the diode cathodes are connected to a common top contact pad. Included is a second diode array integrated circuit having a plurality of diodes, where the second diode array integrated circuit has bottom contact pads corresponding to respective cathodes of said diodes, and the bottom contact pads of said second diode array integrated circuit are bonded to respective lead frame contact terminals. The anodes of the diodes of said second diode array integrated circuit are connected to a common top contact pad. The first and second diode array integrated circuits are positioned side by side on the lead frame structure, and the bottom contact pads of the first and second diode array integrated circuits are bonded to the lead frame structure. An overvoltage protection integrated circuit overlies at least a portion of the first and second diode array integrated circuits, and the overvoltage integrated circuit has bottom contact pads that are bonded directly to the respective top contacts of the first and second diode array integrated circuits.

According to yet another embodiment of the invention, disclosed is a stacked integrated circuit assembly, which includes a lead frame structure having contact terminals, and at least one lower integrated circuit chip attached thereto. Each lower integrated circuit chip has one or more bottom contact pads bonded directly to a top surface of said lead frame structure, and each lower integrated circuit has one or more top contact pads. Further included in the stacked integrated circuit assembly is at least one upper integrated circuit chip overlying at least a portion of the lower integrated circuit chip. The upper integrated circuit chip has one or more bottom contact pads bonded directly to the respective top contact pads of the lower integrated circuit chip. Lastly, the stacked integrated circuit assembly includes no wire bonding and no preforms.

BRIEF DESCRIPTION OF THE DRAWINGS

Further features and advantages will become apparent from the following and more particular description of the preferred and other embodiments of the invention, as illustrated in the accompanying drawings in which like reference characters generally refer to the same parts, functions or elements throughout the views, and in which.

DETAILED DESCRIPTION OF THE INVENTION

Figure 1:
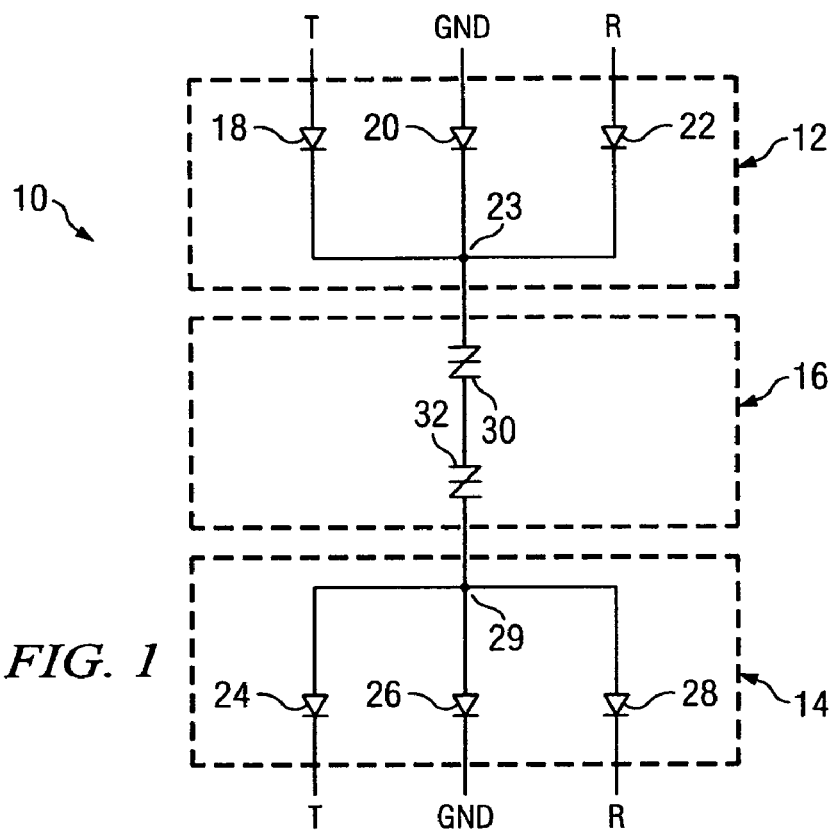
FIG. 1 illustrates in electrical schematic form the circuit of an embodiment of the invention.

With reference now to FIG. 1, there is shown a schematic drawing of a multichip circuit 10 according to a preferred embodiment of the invention. The multichip circuit 10 includes a first diode array chip 12, an overvoltage protection chip 16 and a second diode array chip 14. The first and second diode array chips 12 and 14 form a diode bridge connected to the overvoltage protection chip 16. The multichip circuit 10 can be employed with communication line tip and ring circuits for overvoltage protection thereof. Currents resulting from overvoltages of either polarity are safely carried to ground from either of the tip line or ring line, or both.

The first diode array chip 12 includes a first diode 18, a second diode 20 and a third diode 22, all with the cathodes connected together at a common junction 23. The anode of diode 18 can be connected to the tip conductor of the communication line. The anode of the third diode 22 can be connected to a ring conductor of the communication line. The anode of the second diode 20 can be connected to ground or other fixed potential.

The second diode array chip 14 includes a first diode 24, a second diode 26 and a third diode 28, all with the anodes connected together at a common junction 29. The cathode of diode 24 can be connected to the tip conductor of the communication line. The cathode of the third diode 28 can be connected to the ring conductor of the communication line. The cathode of the second diode 26 can be connected to ground or other fixed potential.

The overvoltage protection chip 16 includes a first overvoltage protection device 30 connected in series to a second overvoltage protection device 32. The overvoltage protection devices 30 and 32 are preferable unidirectional devices. When the unidirectional overvoltage protection devices 30 and 32 are connected to the diode bridge in the manner noted, currents resulting from overvoltages of either polarity can be conducted through both overvoltage protection devices 30 and 32 in the same direction.

The overvoltage protection chip 16 is a preferably a dual device chip capable of handling large surge currents on the order of 200 amps. Since both overvoltage protection devices 30 and 32 are constructed in the same semiconductor chip, the electrical characteristics are matched. In the event that overvoltage protection greater than a threshold of, for example, 300 volts is desired, then the breakover voltage of each device 30 and 32 should be selected for about 150 volts. The series-connected overvoltage protection devices 30 and 32 are effective to present a reduced capacitance to the circuits being protected.

Figure 2:
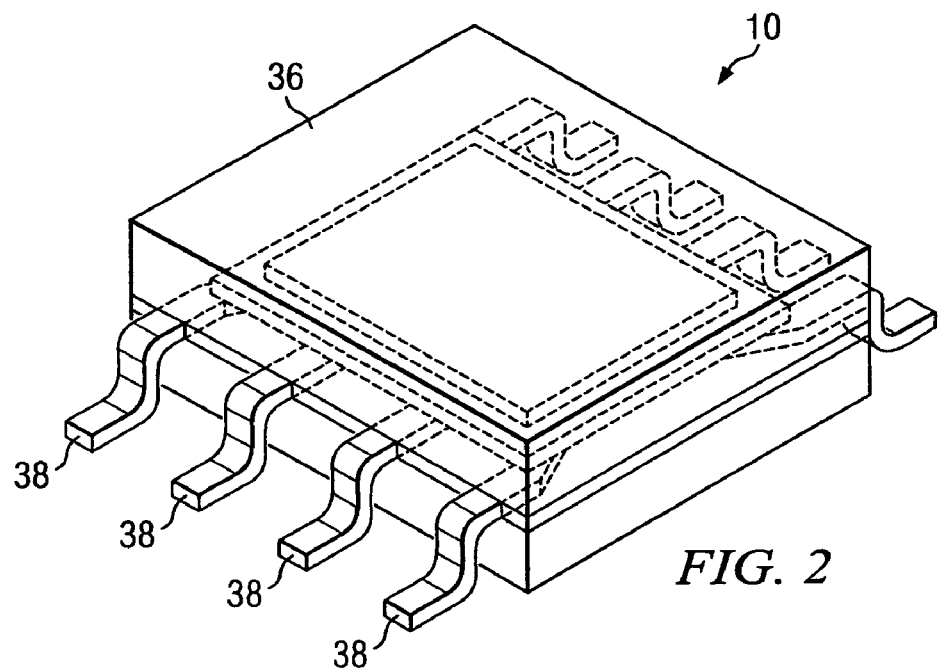
FIG. 2 is an isometric view of a packaged multichip device according to the invention.

In accordance with an important feature of the invention, the first and second diode array chips 12 and 14, as well as the overvoltage protection chip 16, are packaged in a single integrated circuit package 36, such as shown in FIG. 2. The package 36 may be a JEDEC package of the SO-8 type, well known in the art. The SO-8 package is an 8-contact terminal package with the four contact terminals extending from opposite sides of the package 36. One of the eight contact terminals is shown as reference character 38. The contact terminals 38 are bent in the manner shown for soldering to corresponding pads formed on a printed circuit board, or the like. This SO-8 low profile package 36 incorporates three integrated circuit chips 12, 14 and 16 described above. While the SO-8 package is preferred, other package types can be employed, including the QFN package, the ball grid array package, and others. Each of the various packages has different contact terminal configurations and arrangements.

Figure 3A:
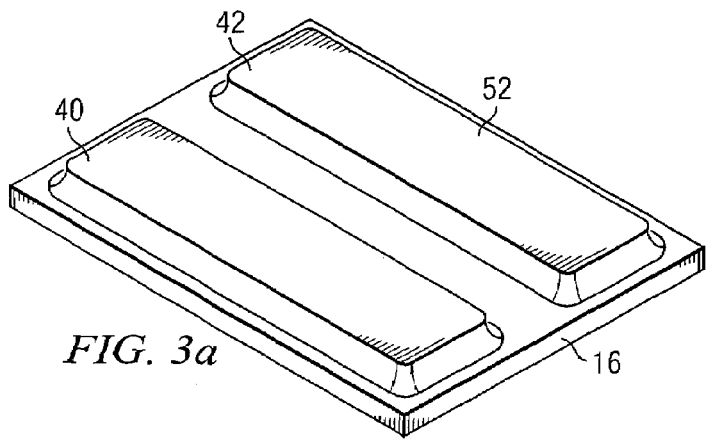
FIGS. 3a and 3b are respective isometric views of a bottom side and a top side of the overvoltage protection chip according to the invention.
Figure 3B:
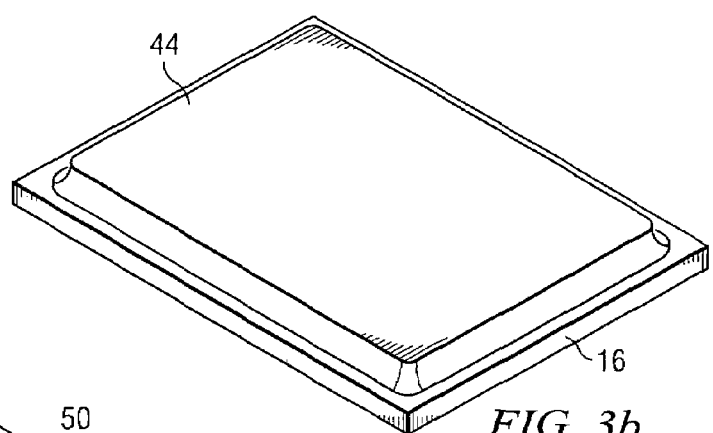

The overvoltage protection chip 16 is shown in FIGS. 3a and 3b. FIG. 3a illustrates a bottom view of the overvoltage protection chip 16, and FIG. 3b illustrates a top view of the overvoltage protection chip 16. The overvoltage protection chip 16 is fabricated as a silicon semiconductor chip or die with dimensions of about 0.105 inch by about 0.160 inch. The thickness of the chip 16, including the metalized areas, is about 0.010 inch. Formed in the silicon chip are two Sidactor overvoltage protection devices 30 and 32, as shown in FIG. 1. The input contact pad is shown as 40 and the output contact pad is shown as 42. The input contact pad 40 is connected during the chip stacking process to the junction 23 (FIG. 1) of the first diode array chip 12. The output contact pad 42 is connected during the chip stacking process to the junction 29 of the second diode array chip 14. The input and output contact pads 40 and 42 are rectangular in shape, as shown. The top large-area contact pad 44 of the overvoltage protection chip 16 of FIG. 3b functions as a heat sink. If desired, the top large-area contact 44 can function to provide an conductive path to the internal junction between the two overvoltage protection devices 30 and 32. In addition, the large-area contact pad 44 can be used to allow all of the active I/O contact pads, in addition to the center junction between the devices 30 and 32, to be formed on the same side of the chip 16. This technique is described in more detail in U.S. Pat. No. 6,448,589 by Casey et al.

Figure 4A:
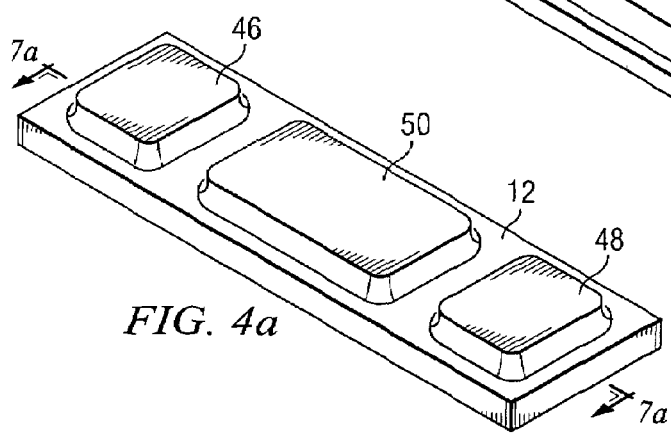
FIGS. 4a and 4b are respective isometric views of a bottom side and a top side of one of the diode array chips according to the invention.
Figure 4B:
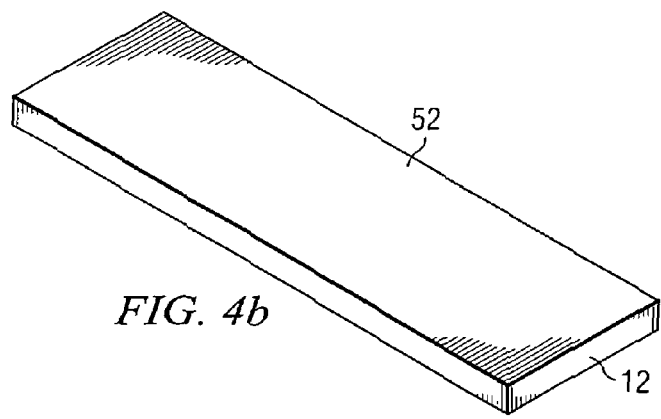

FIGS. 4a and 4b illustrate the diode array chip 12 constructed according to the invention. The diode array chip 12 includes a top surface with three contact pads 46, 48 and 50. The contact pad 46 is connected to the anode of the diode 18 (FIG. 1). The contact pad 48 is connected to the anode of the diode 22. The contact pad 50 is connected to the anode of the diode 20. The contact pad 50 of the diode 20 is about twice the area as each of the contact pads 46 and 48 of diodes 18 and 22. This is because the active semiconductor area of the diode 20 is also about twice the area of each of the diodes 18 and 22.

This provides twice the current carrying capability for the diode 20. In the event that an overvoltage appears on both the tip and the ring communication line conductors, then the current carried by both of the diodes 18 and 22 must be carried through the diode 26 to ground. In like manner, if opposite polarity overvoltages were to be simultaneously imposed on the tip and the ring conductors, the current carried by both diodes 24 and 28 will pass through the diode 20 to ground. The single contact pad 52 on the other side of the diode array chip 12 constitutes a metal area that covers essentially the entire side of the diode array chip 12. The contact pad 52 is internally connected to the common junction 23 (FIG. 1).

The other diode array chip 14 has metalized contacts constructed in a substantially identical manner. The single large-area contact pad of the diode array chip 14 is internally connected to the common anode junction 29. The active semiconductor area of the ground diode 26 is essentially twice the size as that of the other two diodes 24 and 28. The fabrication of the diode array chips 12 and 14 is described below.

Figure 5:
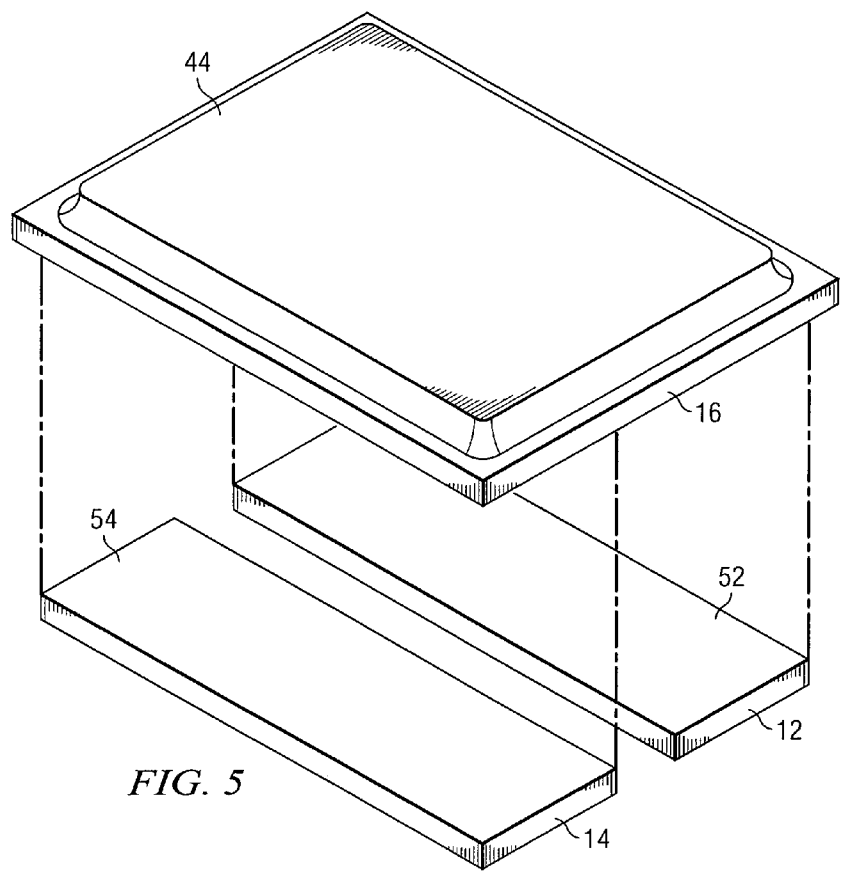
FIG. 5 is an isometric view of the upper overvoltage protection chip removed from the two lower diode array chips.

The three integrated circuit chips 12, 14 and 16 are electrically bonded together by solder or other electrical bonding techniques, in the manner shown in FIG. 5. While solder bonding may be preferable, other bonding techniques, such as nickel or silver-filled epoxy, and other bonding agents, may be employed. In FIG. 5, the overvoltage protection chip 16 is shown oriented with the large-area contact 44 on top. The two rectangular shaped contacts 40 and 42 (FIG. 3a) are on the bottom of the overvoltage protection chip 16. The two diode array chips 12 and 14 are oriented with the large-area contacts 52 and 54 facing upwardly. The top contact 52 of the diode array chip 12 is soldered to the bottom contact 40 of the overvoltage protection chip 16. The top contact 54 of the diode array chip 14 is soldered to the bottom contact 42 of the overvoltage protection chip 16. As will be described in more detail below, the three anode contacts of the diode array chip 12 and the three cathode contacts of the diode array chip 14 are soldered to respective contact terminals of a lead frame. The lead frame includes the contact terminals 38 shown in FIG. 2. In the preferred form of the invention, no electrical contact is made to the large-area contact 44 on top of the overvoltage protection chip 16. A two tiered stack of integrated circuit chips 12, 14 and 16 is thus provided, with two of the chips 12 and 14 being side by side.

Figure 6:
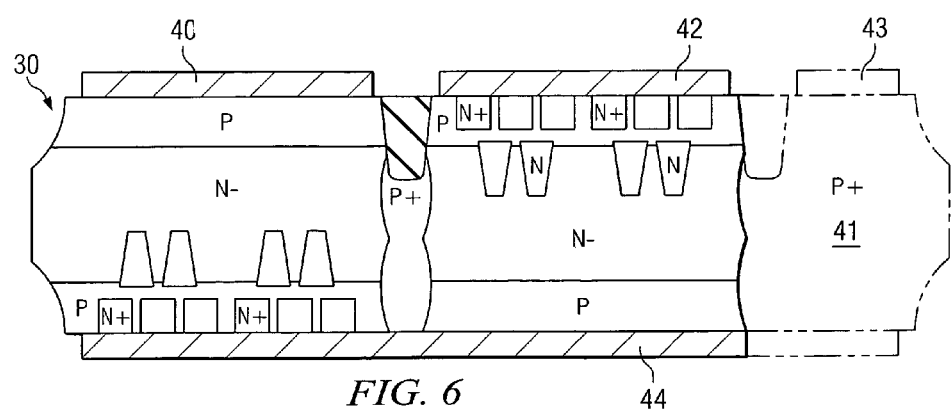
FIG. 6 is a sectional view of the overvoltage protection chip of the invention.

FIG. 6 illustrates in solid lines a cross-sectional view of a twin overvoltage protection device, such as depicted in chip 16 of FIG. 1. An input metal contact 40 is made to the first overvoltage protection device 30. The output metal contact 42 is made to the second overvoltage protection device 32. The large-area metal contact 44 covers the entire surface of the chip 16. The metal contact 44 is shared by both overvoltage protection devices 30 and 32 and provides an interconnection therebetween. In the preferred form of the invention, the metal contact 44 is not connected to the lead frame. However, the metal contact 44 is used to make contact to the junction or node between the two series-connected overvoltage protection devices 30 and 32.

In the event that it is desired to fabricate the chip 16 with all three contacts 40, 42 and 44 available on the same side of the chip 16, then this can be accomplished according to the teachings of U.S. Pat. No. 6,448,589 by Casey et al. The portion of the overvoltage protection chip 16 shown in broken line defines a conductive path between the top and bottom surfaces of the overvoltage protection chip 16. The contact pad 44 is extended via the P+ semiconductor region 41 to the metal contact 43, which is formed on the same side of the chip 16 as the input contact pad 40 and the output contact pad 42. A connection can be made between the contact pad 44 and the lead frame, through the diode chip array chip 12, in the manner described below in connection with FIG. 10. With this arrangement, no bonding wires or preforms are required to make a connection between the top chip and the lead frame.

The other semiconductor regions of the twin overvoltage protection chip 16 can otherwise be fabricated according to the teachings of the '589 patent, the disclosure of which is incorporated herein by reference. While the overvoltage protection devices illustrated in the patent are of the bidirectional type, only unidirectional current-carrying capabilities are necessary. The overvoltage protection devices 30 and 32 are preferably two terminal Sidactor overvoltage protection devices, although other transient voltage suppressors can be employed according to the teachings of the invention.

Figure 7A:
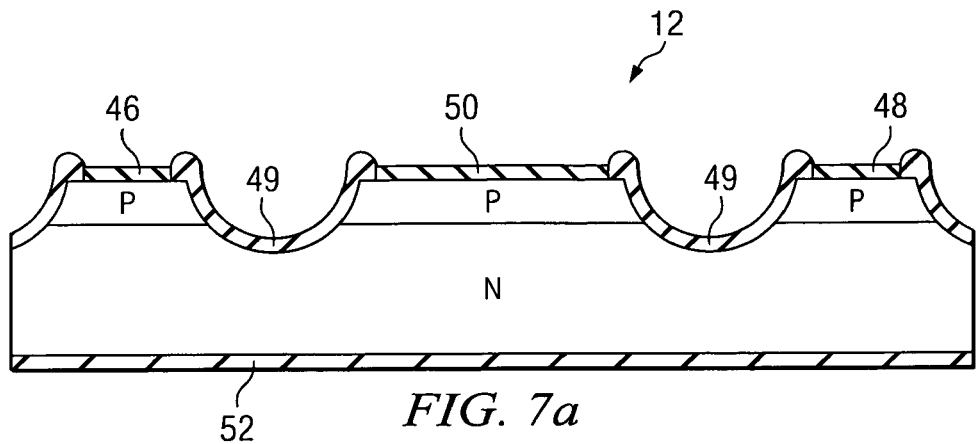
FIGS. 7a and 7b are cross-sectional views of the diode array chips of the invention.

The diode array chip 12 is shown in cross section in FIG. 7a. The starting chip material is N-type. A P-type dopant is diffused into one surface of the N-type chip. Then, the surface of the chip undergoes a mask and etch process for etching through the P-type layer of material down into the N-type substrate. This isolates islands of the P-type layer into the respective individual diodes 18, 20 and 22, all having a common cathode defined by the N-type substrate. A passivation glass material 49 is formed in the etched areas on only one side of the diode array chip 12. This feature is important when multiple chips are stacked one on top of the other. The semiconductor surfaces of the chip 12 are subjected to a metalizing process to form the three top contacts 46, 48 and 50, as well as the bottom common cathode contact 52. As noted above, the common contact 52 defines the junction 23 shown in FIG. 1. The active current-carrying area of the ground diode 20 (in the middle) is about twice that of the tip diode 18 and twice that of the ring diode 22. Stated another way, the combined current carrying capability of the tip and ring diodes 18 and 22 closely matches the surge current capability of the overvoltage protection devices 30 and 32, and the current-carrying capability of the ground diode 26. The current-carrying capability of the diodes 18 and 22 differs from that of the overvoltage protection devices 30 and 32, as well as the ground diode 26, because simultaneous positive polarity overvoltages appearing on the tip and ring lines will cause the current to pass through the tip and ring diodes 18 and 22, be combined at node 23, and the resultant current will pass through the conducting overvoltage protection devices 30 and 32 and the ground diode 26. The size of the ground diode 20 is similarly structured for carrying combined negative polarity currents from the tip and ring diodes 24 and 28 and the overvoltage protection devices 30 and 32. Importantly, the area of the diodes 18 and 22 are no larger than necessary so that the capacitance of the device is minimized. By minimizing the capacitance of the semiconductor devices, such devices can be employed in higher speed applications.

Figure 7B:
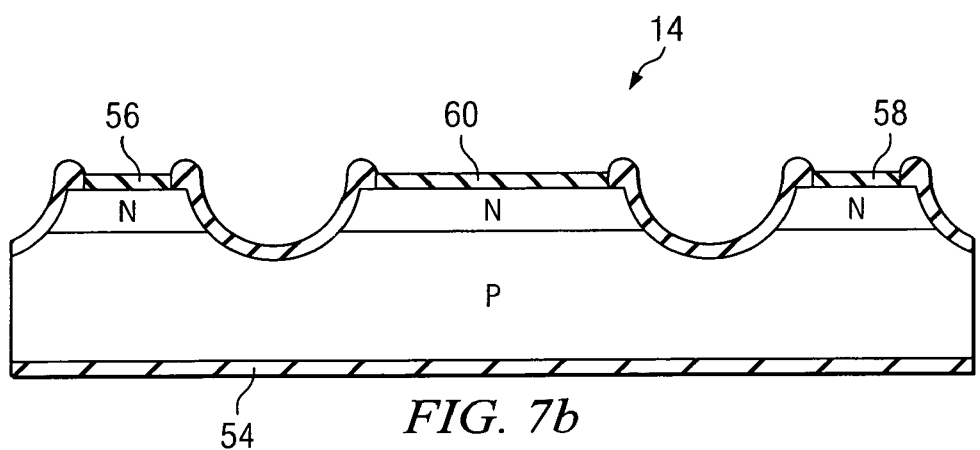

FIG. 7b illustrates a cross-sectional view of the diode array chip 14. The construction of the diode array chip 14 is much like that of diode array chip 12 described above, except the starting substrate is a P-type material, and a thin layer of an N-type material is formed thereon. The top contacts for the respective diodes 24, 26 and 28 (FIG. 1) are identified by numerals 56, 60 and 58. The bottom contact 54 defines the common anode (unction 29) of each of the diodes 24, 26 and 28.

Figure 8A:
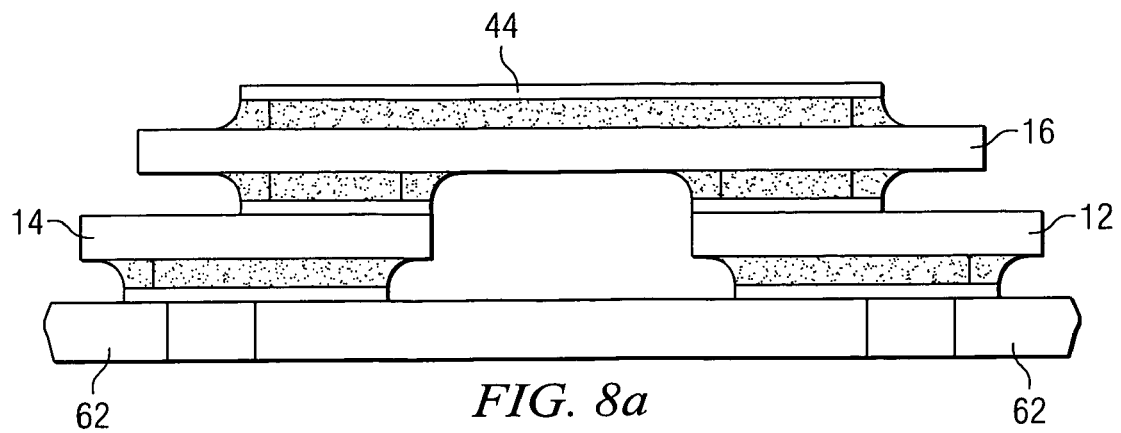
FIGS. 8a, 8b and 8c are respective end, top and bottom views of the stacked chip arrangement bonded to a lead frame, and prior to molding.
Figure 8B:
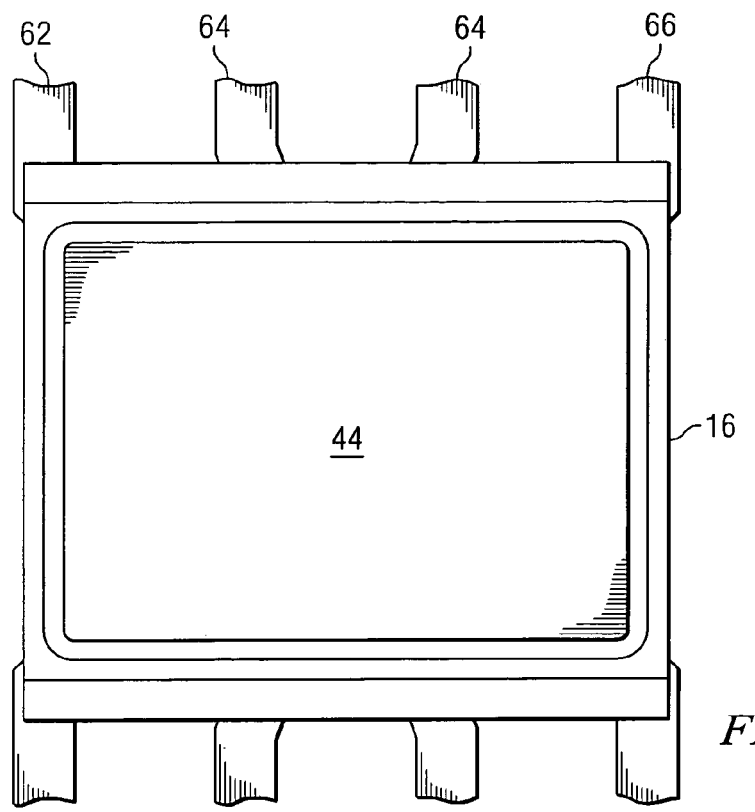
Figure 8C:
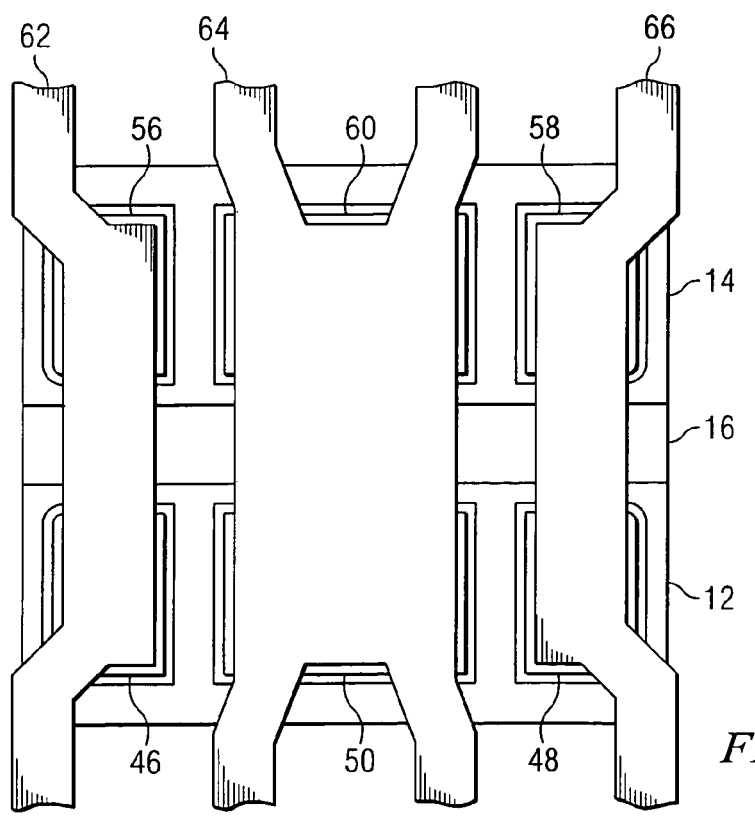

FIG. 8a illustrates and end view of the chip structure of FIG. 8b, and FIG. 8c is a bottom view of FIG. 8b. The chip structure is shown after bonding to lead frame members 62, 64 and 66. In FIGS. 8a, 8b and 8c, the lead frame members 62, 64 and 66 are only shown up to the epoxy mold line of the packaged device. In practice, the lead frame members 62, 64 and 66 extend outside the SO-8 epoxy body, and are formed according to the JEDEC standards and thus appear similar to that shown in FIG. 2. It should be noted that while only the lead frame members 62, 64 and 66 are shown, such lead frame members remain attached during the assembly process to a lead frame carrier (not shown), together with many other lead frame members for other chip assemblies. This allows numerous chip assemblies to be processed serially through the various assembly stations.

In the fabrication process of stacking the chips 12, 14 and 16 together on a lead frame, the lead frame first undergoes a screen print or dispense process where a solder paste is selectively deposited on the lead frame members at locations where it is desired to place the two diode array chips 12 and 14. A solder paste is deposited on lead frame members 62, 64 and 66 to solder the diode array chip 12 thereto. At the same time, a solder paste is deposited on lead frame members 62, 64 and 66 to solder the other diode array chip 14 thereto.

An automated machine then selects the respective diode array chips 12 and 14 and places the same on the lead frame members 62, 64 and 66, at the locations having the solder paste screened thereon. The positioning of the diode array chips 12 and 14 on the lead frame members 62, 64 and 66 is shown in FIG. 8c. The diode array chips 12 and 14 can each be rotated 180 degrees (about a vertical axis) without consequence, as the contacts 46 and 48 of chip 12 provide interchangeable functions. Next, a solder paste is screened onto the top large-area contacts 52 and 54 of the diode array chips 12 and 14.

The lead frame then proceeds to another chip selection station where an overvoltage protection chip 16 is selected and placed on top of the two diode array chips 12 and 14. The orientation of the overvoltage protection chip 16 is important, as it is preferably a unidirectional operating device. In the event that bidirectional operating devices are used to provide protection from overvoltages, then the orientation of the chip about a vertical axis would not be critical. After the overvoltage protection chip 16 is stacked on top of the two side-by-side diode array chips 12 and 14, the assembly proceeds to another screen printing station where the top large-area contact 44 of the overvoltage protection chip 16 has deposited thereon a solder paste. While no external electrical contact is made to the top contact 44 of chip 16, the addition of a mass of solder facilitates heat dissipation of the chip assembly.

As an alternative to the foregoing, the overvoltage protection chip 16 can be first soldered to the two diode array chips 12 and 14. Then in the assembly process, the single stacked arrangement of chips 12, 14 and 16 that have been previously soldered together, can be automatically selected and placed on the lead frame for subsequent reflow soldering.

Figure 9:
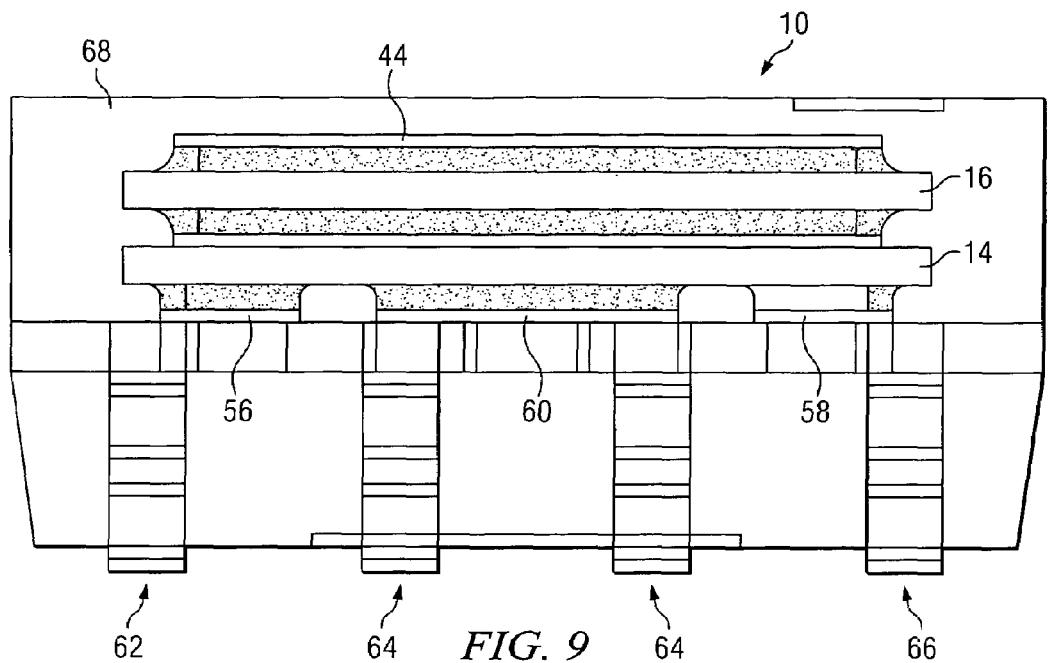
FIG. 9 is a side view of a packaged multichip device according to the invention.

Once the chip assembly has been processed as described above, the assembly proceeds on the lead frame through a solder reflow process in which the solder paste is melted and the respective surfaces are solder bonded together. In other words, the lead frame members 62, 64 and 66 are soldered to the respective contact pads of the two diode array chips 12 and 14. At the same time, the bottom contacts 40 and 42 of the overvoltage protection chip 16 are soldered to the top contacts 52 and 54 of the diode array chips 12 and 14. Lastly, the solder paste deposited on the top large-area contact 44 of the overvoltage protection chip 16 is reflowed. Once the three chips 12, 14 and 16 are soldered together and to the lead frame members 62, 64 and 66, the assembly appears as shown in FIG. 8a. This is a low profile assembly including three chips electrically connected together without the use of bonding wires or preforms. The chip assembly (without the lead frame) is only about 0.020 inches in height and is thus well adapted for use with an SO-8 package, as shown in FIGS. 2 and 9. As noted above, while the SO-8 package is employed in the preferred embodiment, other packages can be used, including the QFN package, and others.

Subsequent to the solder reflow process, the lead frame and chip assembly attached thereto undergo a deflux cleaning where any residual solder flux is removed. Next, the chip assembly and lead frame are encapsulated with a conventional electronics component molding epoxy material. The encapsulant is shown in FIG. 9 as reference numeral 68. The shape of the mold employed is effective to make an SO-8 type package. The low profile nature of the chip assembly enables the SO-8 package to be utilized. Once molded into the SO-8 package, the contact terminals or leads of the package 10 are singulated from the lead frame carrier, the contact terminals are formed into the shape shown in FIG. 2, and the device 10 is removed from the lead frame carrier. Lastly, the contact terminals 38 of the package 10 are plated with a solder composition.

It is noted in FIG. 8c that while there are eight contact terminals used, which is consonant with the SO-8 package, fewer contact terminals are necessary. Six contact terminals are convenient to provide connections to the ground and the tip and ring conductors of a communication or other type of line. Indeed, only three different contact terminals of the package are necessary, as the two tip contact terminals are routinely connected to the same communication line conductor, and the two ring contact terminals are routinely connected to the same communication line ring conductor. A single ground contact terminal is also necessary. However, the utilization of multiple contact terminals enables the heat generated during conduction of the overvoltage protection devices 30 and 32 and the diodes to be readily dissipated to the printed circuit board to which the package 10 is connected.

Figure 10:
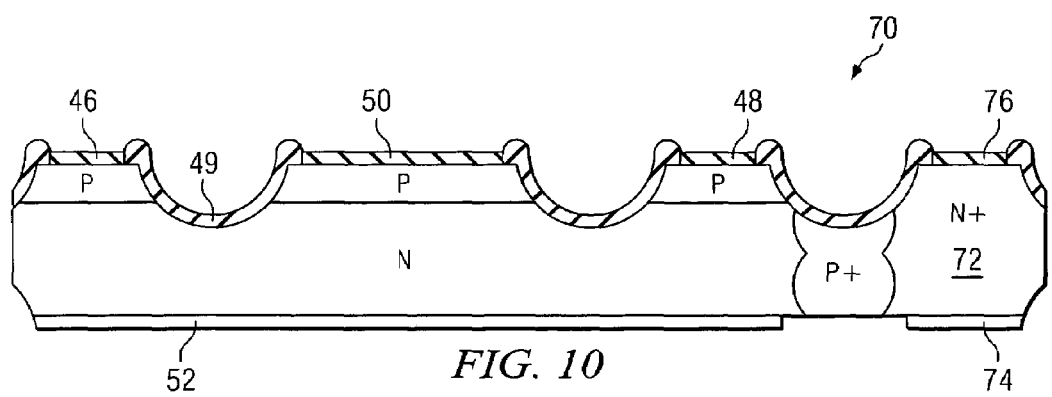
FIG. 10 is a cross-sectional view of another embodiment of a diode array chip of the invention.

FIG. 10 depicts a diode array chip 70, much like that shown in FIG. 7a, except the chip 70 includes a conductive path 72 between the contact pads 74 and 76 which are located on opposite sides of the chip 70. The P+ semiconductor region 72 is isolated from the other semiconductor regions of the chip 70. However, the conductive path from one side of the chip 70 to the other side can be employed to provide continuity between the contact pad 43 of the overvoltage protection chip 16 shown in FIG. 6, to a lead frame member. In other words, when the chip 16 of FIG. 6 is stacked on top of the chip 70 of FIG. 10 so that the contact pad 43 of chip 16 is soldered to the contact pad 74 of chip 70, and the contact pad 76 is soldered to a lead frame member, an internal connection is made between a top contact pad 44 of the overvoltage protection chip 16 and the lead frame member. As noted above, this connection is internal to the chips and is made without the use of bonding wires or metal preforms.

The utilization of the internal contact path described above can be used in many other types of stacked integrated circuit chips to provide connections between the bottom chip and the lead frame. The internal conductive path can also be employed in the top chip and in the bottom chip to provide a conductive path between the top surface of the top chip and the lead frame via the bottom chip.

From the foregoing, disclosed is a technique, and corresponding device, that incorporates stacked integrated circuit chips in a small package without the necessity of wire bonds or preforms. At least one of the top or bottom chips have an interface surface that is flat and well adapted for soldering to the other chip(s). All of the I/O contact pads are located on the bottom chip(s), thereby enabling easy connection to a lead frame. In this manner, the current flows from a lead frame member to the bottom chip, then to the top chip and back to the bottom chip where the current then flows into another lead frame member. The top chip requires no direct connections to the lead frame, thereby facilitating the connection and assembly process.

While the preferred and other embodiments of the invention have been disclosed with reference to specific circuit and semiconductor structures, it is to be understood that many changes in detail may be made as a matter of engineering choices without departing from the spirit and scope of the invention, as defined by the appended claims.

What is claimed is:

1. A stacked integrated circuit assembly, comprising:
   a lead frame structure having contact terminals;
   a first diode array integrated circuit having a plurality of diodes, said first diode array integrated circuit having bottom contact pads corresponding to respective anodes of said diodes, said bottom contact pads bonded to respective lead frame contact terminals, and cathodes of said diodes connected to a common top contact pad of said first diode array integrated circuit;
   a second diode array integrated circuit having a plurality of diodes, said second diode array integrated circuit having bottom contact pads corresponding to respective cathodes of said diodes of said second diode array integrated circuit, said bottom contact pads of said second diode array integrated circuit bonded to respective lead frame contact terminals, and anodes of said diodes of said second diode array integrated circuit connected to a common top contact pad of said second diode array integrated circuit;
   said first and second diode array integrated circuits positioned side by side on said lead frame structure, and the bottom contact pads of said first and second diode array integrated circuits bonded to said lead frame structure; and
   an overvoltage protection integrated circuit overlying at least a portion of said first and second diode array integrated circuits, said overvoltage protection integrated circuit having bottom contact pads bonded directly to the respective top contacts of said first and second diode array integrated circuits.

2. The stacked integrated circuit assembly of claim 1, wherein said integrated circuits and contact pads are arranged so that current that passes through the first diode array integrated circuit passes through the overvoltage protection integrated circuit and then through the second diode array integrated circuit.

3. The stacked integrated circuit assembly of claim 1, wherein said overvoltage protection integrated circuit includes two series-connected overvoltage protection devices.

4. The stacked integrated circuit assembly of claim 3, wherein each said overvoltage protection device comprises a two-terminal Sidactor device.

5. The stacked integrated circuit assembly of claim 1, wherein each said first and second diode array integrated circuit includes three diodes.

6. The stacked integrated circuit assembly of claim 1, wherein said integrated circuits and said lead frame structure are packaged in one of an SO-8 package or a QFN package.

7. A stacked integrated circuit assembly, comprising:
   a lead frame having eight terminals with four terminals on one side of said stacked integrated circuit assembly and four terminals on an opposite side of said stacked integrated circuit assembly;
   a first diode array integrated circuit having a top contact pad, and three bottom contact pads aligned in a row, a second bottom contact pad having about twice the surface area as a first bottom contact pad and a third bottom contact pad;
   said first bottom contact pad connected to a first terminal of said lead frame, and said second bottom contact pad connected to a second and third terminals of said lead frame and said third bottom contact pad connected to a fourth terminal of said lead frame;
   a second diode array integrated circuit having a top contact pad, and three bottom contact pads aligned in a row, a second bottom contact pad of said second diode array integrated circuit having about twice the surface area as a first bottom contact pad and a third bottom contact pad of said second diode array integrated circuit;
   said first diode array integrated circuit and said second diode array integrated circuit together comprising a diode bridge;
   said first bottom contact pad of said second diode array integrated circuit connected to a fifth terminal of said lead frame, and said second bottom contact pad of said second diode array integrated circuit connected to a sixth and seventh terminals of said lead frame, and said third bottom contact of said second diode array integrated circuit connected to an eighth terminal of said lead frame; and
   a thyristor integrated circuit lying on top of at least a portion of said first and second diode array integrated circuits, said thyristor integrated circuit having two bottom contact pads electrically bonded directly to the respective top contact pads of said first and second diode array integrated circuits without using preforms or wires.

8. The stacked integrated circuit assembly of claim 7, wherein said lead frame is constructed so that said first and fifth terminals are connected together, said second, third, sixth and seventh terminals are connected together, and said fourth and eighth terminals are connected together.

9. The stacked integrated circuit assembly of claim 7, further including:
   a diode associated with the second contact pad of said first diode array integrated circuit has a current carrying capability about twice that of respective diodes associated with said first and third contact pads of said first diode array integrated circuit; and
   a diode associated with the second contact pad of said second diode array integrated circuit has a current carrying capability about twice that of respective diodes associated with said first and third contact pads of said second diode array integrated circuit.

10. The stacked integrated circuit assembly of claim 7, wherein said first diode array integrated circuit is formed in a P-type substrate, and said second diode array integrated circuit is formed in an N-type substrate.

11. A stacked integrated circuit assembly, comprising:
    a lead frame having a first, second and third metal strips, where the first, second and third metal strips are not connected together in said stacked integrated circuit assembly;
    a first integrated circuit having three bottom contact pads electrically connected respectively to the first, second and third metal strips of said lead frame, said first integrated circuit having substantially an entire top surface thereof comprising a top contact pad;
    a second integrated circuit having a top and bottom contact pad arrangement substantially identical to that of said first integrated circuit, the bottom contact pads of said second integrated circuit electrically connected respectively to the first, second and third metal strips of said lead frame, said first and second integrated circuits arranged side by side on said lead frame; and a third integrated circuit having two elongate bottom contact pads, each about the same size as the top contact pads of said first and second integrated circuits, the bottom contact pads of said third integrated circuit electrically connected respectively to the top contact pads of said first and second integrated circuits, whereby a stacked arrangement is provided without using preforms or wires.

12. The stacked integrated circuit assembly of claim 11, wherein:

said first integrated circuit comprises at least three diodes, where each said diode has a cathode connected in common together, and the common cathode of said first integrated circuit is connected to the top contact pad thereof;

said second integrated circuit comprises at least three diodes, where each said diode has an anode connected in common together, and the common anode of said second integrated circuit is connected to the top contact pad thereof;

an anode of a first diode of said first integrated circuit is connected to a cathode of a first diode of said second integrated circuit via said first metal strip of said lead frame;

an anode of a second diode of said first integrated circuit is connected to a cathode of a second diode of said second integrated circuit via said second metal strip of said lead frame; and an anode of a third diode of said first integrated circuit is connected to a cathode of a third diode of said second integrated circuit via said third metal strip of said lead frame.

13. The stacked integrated circuit assembly of claim 12, wherein:

said third integrated circuit includes a thyristor circuit responsive to an overvoltage for being driven into a conductive state, and a first terminal of said thyristor circuit is connected to one said elongate bottom contact pad of the third integrated circuit which is electrically bonded to the top contact pad of said first integrated circuit and thus to the common cathode of said first integrated circuit, and a second terminal of said thyristor circuit is connected to the other said elongate bottom contact pad of the third integrated circuit which is electrically bonded to the top contact pad of said second integrated circuit and thus to the common anode of said second integrated circuit.

14. A stacked integrated circuit assembly, comprising:

a lead frame structure having contact terminals;

a first diode array integrated circuit having bottom contact pads bonded to respective lead frame contact terminals;

a second diode array integrated circuit having bottom contact pads bonded to respective lead frame contact terminals;

said first and second diode array integrated circuits positioned side by side and on said lead frame structure, said first and second diode array integrated circuits each having at least one top contact pad;

said first diode array integrated circuit and said second diode array integrated circuit together constitute a diode bridge; and a thyristor integrated circuit lying on top of at least a portion of said first and second diode array integrated circuits, said thyristor integrated circuit having bottom contact pads bonded in electrical contact directly to the top contacts of said first and second diode array integrated circuits without using preforms or wires.

15. The stacked integrated circuit assembly of claim 14, wherein said thyristor integrated circuit comprises at least one overvoltage protection device, whereby when said overvoltage protection device conducts in response to an overvoltage, current passes through a bridge diode of said first integrated circuit, then through the overvoltage protection device, and then through a bridge diode of the second integrated circuit.

16. The stacked integrated circuit assembly of claim 14, wherein said lead frame is formed in one of an SO-8 package or a QFN package.

17. The stacked integrated circuit assembly of claim 14, wherein said first and second diode array integrated circuits each include only three bottom contact pads and a single top contact pad.

18. The stacked integrated circuit assembly of claim 17, wherein said thyristor integrated circuit includes only two bottom contact pads.

19. The stacked integrated circuit assembly of claim 17, wherein the single top contact pads of said first and second diode array integrated circuits extend over substantially the entire top surfaces of said first and second diode array integrated circuits.

20. The stacked integrated circuit assembly of claim 19, wherein the bottom contact pads of said thyristor integrated circuit each have an area substantially the same as an area of the respective top contact pad of each said first and second diode array integrated circuit.

21. The stacked integrated circuit assembly of claim 14, wherein the first and second diode array integrated circuits each include only a single contact pad in electrical contact with the thyristor integrated circuit.

* * * * *